(12) United States Patent
Shin et al.

(10) Patent No.: US 7,535,308 B2
(45) Date of Patent: May 19, 2009

(54) VOLTAGE-CONTROLLED OSCILLATOR DECREASING PHASE NOISE

(75) Inventors: So Bong Shin, Seongnam-si (KR); Tae Hun Kim, Guri-si (KR)

(73) Assignee: Radiopulse Inc. (KR)

( * ) Notice: Subject to any disclaimer, the term of this patent is extended or adjusted under 35 U.S.C. 154(b) by 125 days.

(21) Appl. No.: 11/835,513

(22) Filed: Aug. 8, 2007

(65) Prior Publication Data

US 2008/0174376 A1    Jul. 24, 2008

(30) Foreign Application Priority Data

Jan. 19, 2007  (KR) ................. 10-2007-0006103
Jan. 19, 2007  (KR) ................. 10-2007-0006131

(51) Int. Cl.
 *H03B 5/08*  (2006.01)
(52) U.S. Cl. ............. 331/167; 331/117 R; 331/117 FE; 331/177 V; 331/36 C; 331/185

(58) Field of Classification Search ............. 331/177 V, 331/117 R, 117 FE, 167, 36 C, 185
See application file for complete search history.

(56) References Cited

U.S. PATENT DOCUMENTS 7,026,883 B2 * 4/2006 Muthali et al. ............... 331/183
2006/0261902 A1 * 11/2006 Masuda et al. ............... 331/3 C

* cited by examiner

*Primary Examiner*—Arnold Kinkead
(74) *Attorney, Agent, or Firm*—Cantor Colburn LLP (57) ABSTRACT

A voltage-controlled oscillator includes an LC bank, a negative resistor circuit, a DC block, an AC block including a source resistor, and a first bias circuit controlled by a junction node of a first and second transistor, wherein the first bias circuit provides a first feedback voltage to a first control node, and maintains a voltage at the junction node of the first and second transistors, and a second bias circuit controlled by the junction node, wherein the second bias circuit provides a second feedback voltage to a second control node and maintains a voltage at the junction node.

14 Claims, 5 Drawing Sheets

VOLTAGE-CONTROLLED OSCILLATOR DECREASING PHASE NOISE

This application claims priority to Korean Patent Application No. 10-2007-0006103 and Korean Patent Application No. 10-2007-0006131, both filed on Jan. 19, 2007, and all benefits accruing therefrom under 35 U.S.C. § 119, the contents of which in their entirety are herein incorporated by reference.

BACKGROUND OF THE INVENTION

1. Field of the Invention

The present invention disclosed herein relates to voltage-controlled oscillators. More particularly, the present invention disclosed herein relates to a voltage-controlled oscillator capable of decreasing phase noise.

2. Discussion of the Related Art

Generally, voltage-controlled oscillators ("VCOs") are a specific type of electronic circuit which vary control voltages and generate frequency signals. VCOs are widely employed in analog sound synthesizers, mobile communication terminals, and various other similar devices.

Figure 1:
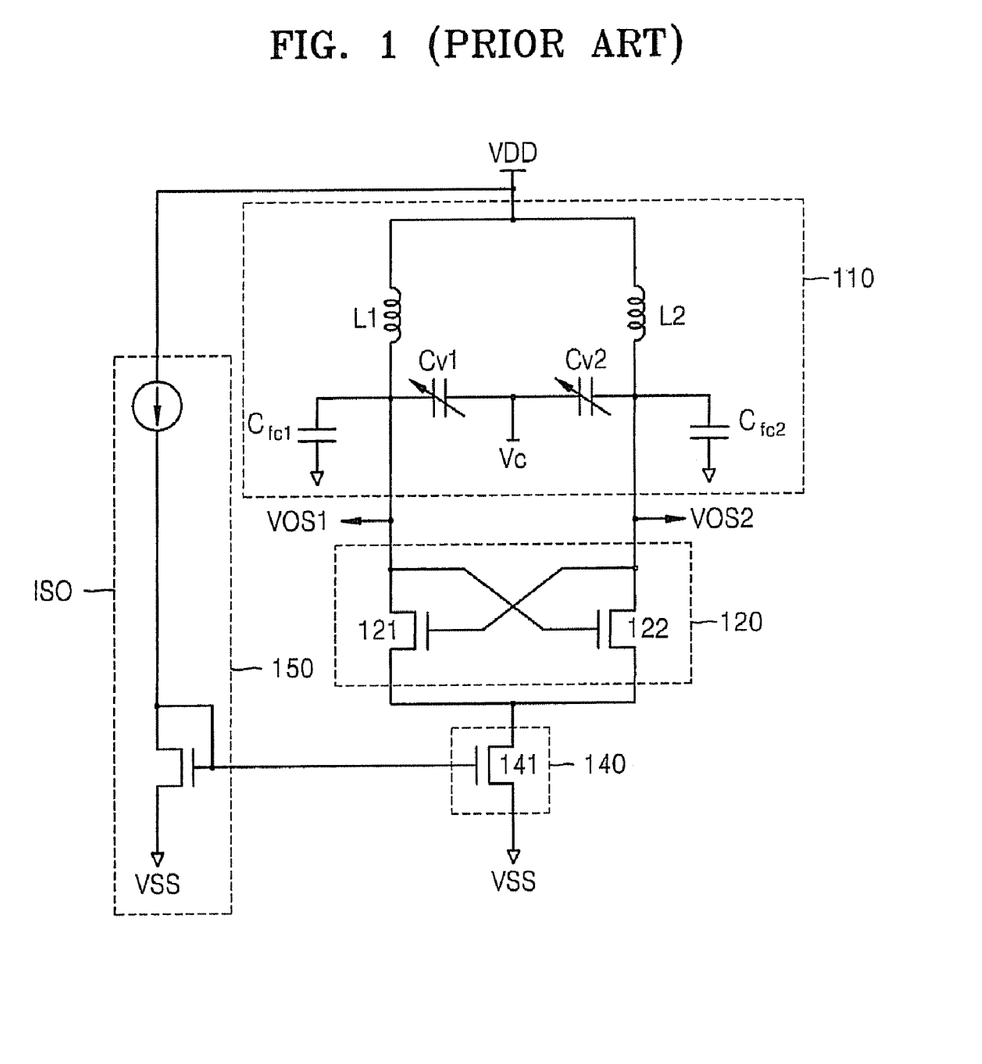
FIG. 1 is an equivalent circuit diagram of a prior art voltage-controlled oscillator "VCO"

FIG. 1 is a circuit diagram of a voltage-controlled oscillator of the prior art. The VCO of FIG. 1 includes an inductor-capacitor ("LC") bank 110 including inductors L1 and L2, static capacitors Cf1 and Cf2, and variable capacitors Cv1 and Cv2. The static capacitors Cf1 and Cf2 have a static value. A control voltage Vc controls capacitance values of the variable capacitors Cv1 and Cv2 in order to activate first and second oscillation signals VOS1 and VOS2, which are generated from the LC bank 110, in a required frequency. And, a negative resistor circuit 120 functions to maintain the activation of the oscillation signals VOS1 and VOS2.

The VCO shown in FIG. 1 is a differential type of VCO, in which the first and second oscillation signals VOS1 and VOS2 are different in phase by 180°. The negative resistor circuit 120 is connected to a current source circuit 140. A bias circuit 150 supplies a bias voltage to an n-channel metal-oxide-semiconductor ("NMOS") transistor 141 of the current source circuit 140.

In the VCO of FIG. 1, an amount of noise corresponding to 1/f, wherein f is the frequency of the bias voltage, is generated by the NMOS transistors 141 of the current source circuit 140. The 1/f noise arising from the NMOS transistor 141 is reflected in the first and second oscillation signals VOS1 and VOS2 that are output signals of the VCO.

Therefore, the VCO shown in FIG. 1 has a problem that a rate of phase noise becomes higher due to the 1/f noise.

BRIEF SUMMARY OF THE INVENTION

Accordingly, the present invention provides a VCO capable of decreasing phase noise.

In one exemplary embodiment of a the present invention a voltage-controlled oscillator includes; an inductor-capacitor ("LC") bank supplied with a power source voltage and a control voltage, wherein the LC bank oscillates first and second oscillation nodes from which first and second oscillation signals are generated, respectively, a negative resistor circuit including first and second control nodes and first and second transistors which provide negative resistance to the LC bank, wherein the negative resistor circuit maintains the oscillation of the first and second oscillation nodes, a direct current ("DC") block which couples the second oscillation node with the first control node and couples the first oscillation node with the second control node, wherein the first control node controls the first transistor and the second control node controls the second transistor, an alternating current ("AC") block including a source resistor disposed between a junction node, which is connected to the first and second transistors, and a ground voltage, a first bias circuit controlled by the junction node, wherein the first bias circuit provides a first feedback voltage to the first control node and maintains a voltage at the junction node of the first and second transistors, and a second bias circuit controlled by the junction node, wherein the second bias circuit provides a second feedback voltage to the second control node and maintains a voltage at the junction node of the first and second transistors.

In another exemplary embodiment of the present invention a voltage-controlled oscillator includes; an inductor-capacitor bank supplied with a power source voltage and a control voltage, wherein the inductor-capacitor bank oscillates first and second oscillation nodes from which first and second oscillation signals are generated, respectively, a negative resistor circuit including first and second control nodes and first and second transistors which provide negative resistance to the inductor-capacitor bank, wherein the negative resistor circuit maintains the oscillation of the first and second oscillation nodes, a direct current block which couples the second oscillation node with the first control node and couples the first oscillation node with the second control node, wherein the first control node controls the first transistor and the second control node controls the second transistor, an alternating current block including a source resistor disposed between a junction node, which is connected to the first and second transistors, and a ground voltage; and a bias circuit controlled by the junction node, wherein the first bias circuit provides first and second feedback voltages to the first and second control nodes, respectively, and maintains a voltage at the junction node of the first and second transistors.

A further understanding of the nature and advantages of the present invention may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
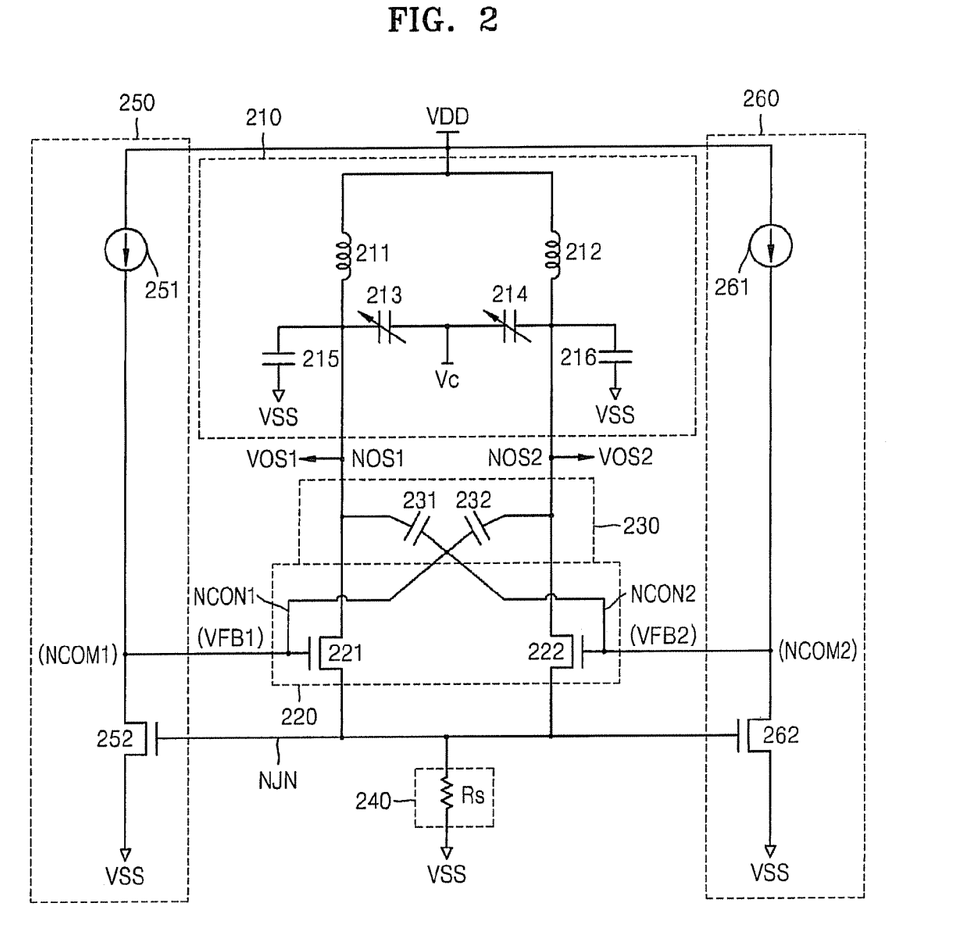
FIG. 2 illustrates an exemplary embodiment of a VCO according to the present invention.

FIG. 2 illustrates an exemplary embodiment of a voltage-controlled oscillator ("VCO") according to the present invention. Referring to FIG. 2, the VCO includes an inductor-capacitor ("LC") bank 210, a negative resistor circuit 220, a direct current ("DC") block 230, an alternating current ("AC") block 240, a first bias circuit 250, and a second bias circuit 260.

The LC bank 210 is supplied with a power source voltage VDD, including first and second oscillation nodes NOS1 and NOS2 from which first and second oscillation signals VOS1 and VOS2 are generated, respectively. The LC bank 210 includes a first inductor 211, a second inductor 212, a first oscillation capacitor 213, and a second oscillation capacitor 214.

The first inductor 211 is connected between the first oscillation node NOS1 and the power source voltage VDD, and the second inductor 212 is connected between the second oscillation node NOS2 and the power source voltage VDD.

The first oscillation capacitor 213 is coupled between the first oscillation node NOS1 and a control voltage Vc, and the second oscillation capacitor 214 is coupled between the second oscillation node NOS2 and the control voltage Vc.

In one exemplary embodiment the first and second oscillation capacitors 213 and 214 are variable capacitors regulated by the control voltage Vc.

The first and second oscillation signals VOS1 and VOS2 are generated from the LC bank 210 due to the modification of the power source voltage VDD by the first inductor 211, the second inductor 212, the first oscillation capacitor 213, and the second oscillation capacitor 214. In one exemplary embodiment, the first and second oscillation signals VOS1 and VOS2 differ in phase by about 180°. The oscillation signals are regulated by the control voltage Vc.

The negative resistor circuit 220 includes first and second transistors 221 and 222. The first and second transistors 221 and 222 supply a negative resistance to the LC tank 210, which enables the first and second oscillation nodes NOS1 and NOS2 to continue to operate.

In one exemplary embodiment the first and second transistors 221 and 222 are n-channel metal-oxide-semiconductor ("NMOS") transistors.

The DC block 230 couples a first control node NCON1 to the second oscillation node NOS2 and a second control node NCON2 to the first oscillation node NOS1.

In one exemplary embodiment the DC block 230 includes a first DC block capacitor 231 and a second DC block capacitor 232. The first DC block capacitor 231 is coupled between the second control node VCON2 and the first oscillation node NOS1. While the first DC block capacitor 231 electrically disconnects the second control node NCON2 from the first oscillation node NOS1, the first oscillation signal VOS1 from the first oscillation node NOS1 can still be coupled to the second control node NCON2 when the first oscillation signal VOS1 oscillates at a sufficiently high frequency.

The second DC block capacitor 232 is coupled between the first control node VCON1 and the second oscillation node NOS2. Similar to the first DC block capacitor 231, while the second DC block capacitor 232 electrically disconnects the first control node NCON1 from the second oscillation node NOS2, the second oscillation signal VOS2 from the first oscillation node NOS1 can still be coupled to the first control node NCON1 when the second oscillation signal VOS2 oscillates at a sufficiently high frequency.

In the current exemplary embodiment, the first control node NCON1 is connected to a gate of the first transistor 221. The second control node NCON2 is connected to a gate of the second transistor 222. Thus, the first and second transistors 221 and 222 are each configured to prevent the flow of current from the LC bank 210.

The AC block 240 is formed by including a source resistor Rs connected between junction nodes NJN of the first and second transistors 221 and 222, e.g., between their sources, and a ground voltage VSS.

As such, since the AC block 240 includes the source resistor Rs, it is able to decrease the phase noise of the oscillation signals VOS1 and VOS2 due to the 1/f noise.

In one exemplary embodiment of the VCO according to the present invention the junction node NJN of the first and second transistors 221 and 222 is held at a predetermined bias voltage (e.g., 0.7V which may be equivalent to a threshold voltage of the first and second transistors 221 and 222) in spite of variation of the power source voltage VDD, which makes the AC block 240 operate as an excellent current source. For this reason the current exemplary embodiment of a VCO includes the first and second bias circuits 250 and 260.

The first bias circuit 250 is controlled by the junction node NJN of the first and second transistors 221 and 222, and provides a first feedback voltage VFB 1 to the first control node NCON1.

The first bias circuit 250 includes a first voltage supply 251 and a third transistor 252. The first voltage supply 251 is interposed between the power source voltage VDD and a first common connection node NCOM1 electrically connected to the first control node NCON1. The first voltage supply 251 therefore supplies a current to the first control node NCON1, and the third transistor 252. The third transistor 252 is connected between the first common connection node NCOM1 and the ground voltage VSS, and is controlled by a voltage level of the junction node NJN of the first and second transistors 221 and 222.

In one exemplary embodiment the third transistor 252 is an NMOS transistor. In such an exemplary embodiment a gate of the third transistor 252 is coupled to the junction node NJN of the first and second transistors 221 and 222.

The second bias circuit 260 is controlled by the junction node NJN of the first and second transistors 221 and 222, and provides a second feedback voltage VFB2 to the second control node NCON2.

The second bias circuit 260 includes a second voltage supply 261 and a fourth transistor 262. The second voltage supply 261 is interposed between the power source voltage VDD and a second common connection node NCOM2, which is electrically connected to the second control node NCON2. The second voltage supply 261 supplies a current to the second control node NCON2 and the fourth transistor 262. The fourth transistor 262 is connected between the second common connection node NCOM2 and the ground voltage VSS, and is controlled by a voltage level of the junction node NJN of the first and second transistors 221 and 222.

In one exemplary embodiment the fourth transistor 262 is an NMOS transistor. In such an exemplary embodiment a gate of the fourth transistor 262 is coupled to the junction node NJN of the first and second transistors 221 and 222.

The third and fourth transistors 252 and 262 of the first and second bias circuits 250 and 260 contribute to maintain a stable voltage at the junction node NJN of the first and second transistors 221 and 222.

For example, if a voltage level at the junction node NJN of the first and second transistors 221 and 222 rapidly rises, conductance of the third and fourth transistors 252 and 262 temporarily increases. Then, the voltage levels of the first and second common connection nodes NCOM1 and NCOM2, and therefore also the voltage levels of the first and second control nodes NCON1 and NCON2, decrease to lower a voltage level at the junction node NJN of the first and second transistors 221 and 222.

Conversely, if a voltage level at the junction node NJN of the first and second transistors 221 and 222 rapidly decreases, conductance of the third and fourth transistors 252 and 262 temporarily decreases. Then, the first and second common connection nodes NCOM1 and NCOM2, and therefore also the voltage levels of the first and second control nodes NCON1 and NCON2, increases to raise a voltage level at the junction node NJN of the first and second transistors 221 and 222.

Thus, the junction node NJN of the first and second transistors 221 and 222 is able to maintain its voltage level with stability.

In the exemplary embodiment shown in FIG. 2, Cf1 and Cf2 denote static capacitors, e.g., fixed-value capacitors.

Figure 3:
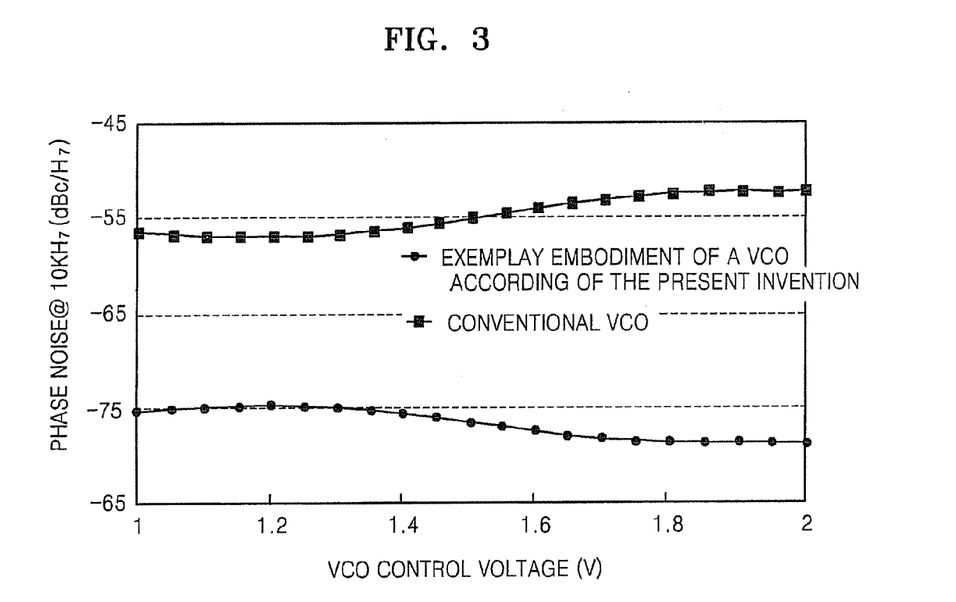
FIG. 3 shows a simulated result of a change of phase noise with respect to a control voltage Vc for a conventional VCO and an exemplary embodiment of a VCO according to the present invention.
Figure 4:
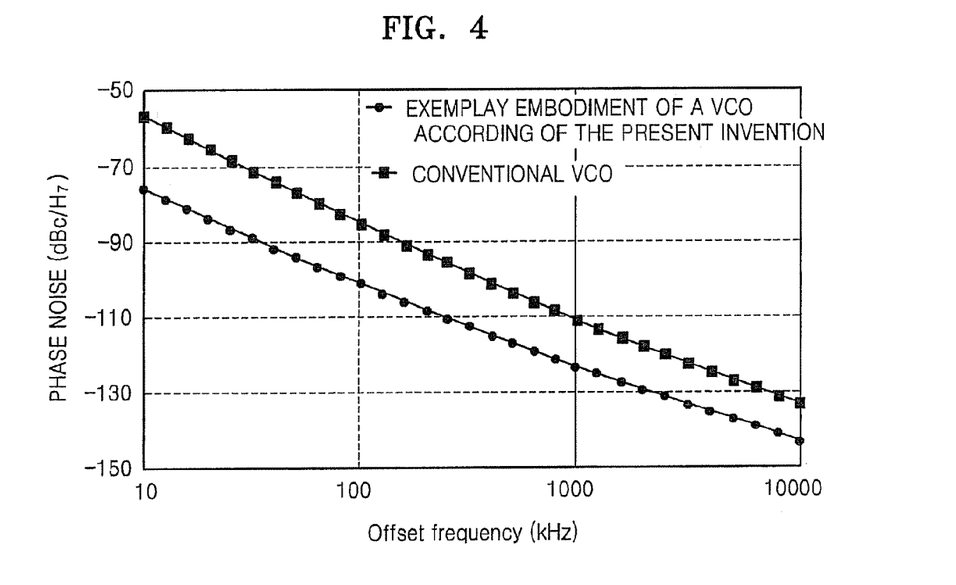
FIG. 4 shows a simulated result of a change of phase noise with respect to an offset frequency of the control voltage, wherein the control voltage Vc is about 1.5V for a conventional VCO and an exemplary embodiment of a VCO according to the present invention.

FIGS. 3 and 4 show a simulated result of a change of phase noise with respect to a control voltage Vc for a conventional VCO and an exemplary embodiment of a VCO according to the present invention and a simulated result of a change of phase noise with respect to an offset frequency of the control voltage, wherein the control voltage Vc is about 1.5V for a conventional VCO and an exemplary embodiment of a VCO according to the present invention, respectively.

From the results of FIGS. 3 and 4, it can be seen that the exemplary embodiment of a VCO according to the present invention as shown in FIG. 2 has a reduced amount of phase noise when compared with the conventional VCO as shown in FIG. 1.

Figure 5:
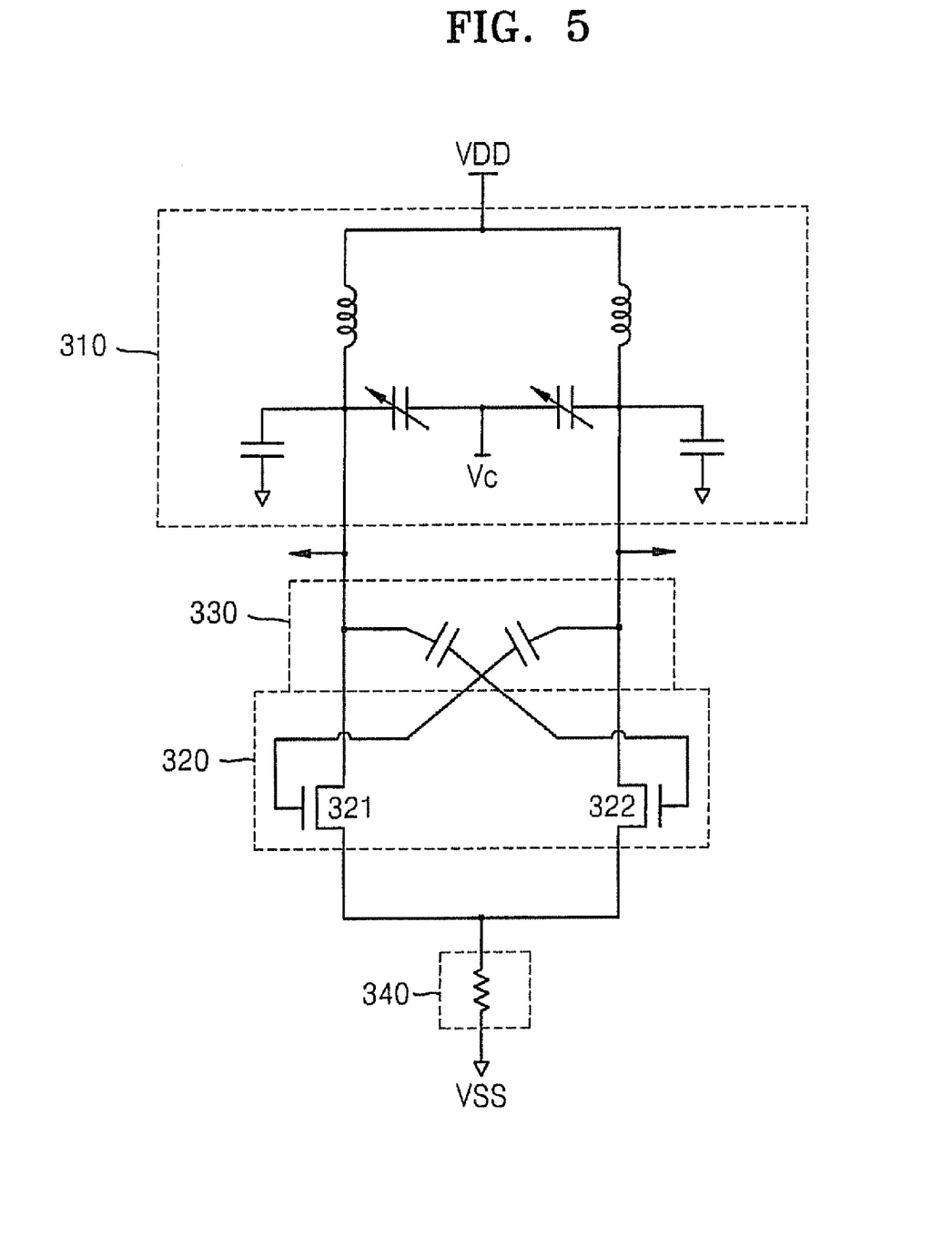
FIG. 5 shows a comparative example of a VCO.

In the meantime, a comparative example of a VCO is shown in FIG. 5. The comparative example as shown in FIG. 5 includes an LC bank 310, a negative resistor circuit 320, a DC block 330, and an AC block 340. Here, the LC bank 310, the negative resistor circuit 320, and the DC block 330 are substantially similar to the LC bank 210, the negative circuit 220, and the DC block 230 both in structure and in operation, and therefore further description thereof will be omitted.

Comparing the feature of the comparative example shown in FIG. 5 with the exemplary embodiment of the present invention as shown in FIG. 2, the first and second bias circuits 250 and 260 are omitted from the comparative example of a VCO shown in FIG. 5.

The VCO may also regulate current consumption and operational characteristics regardless of variations of the power source voltage VDD. For this purpose, in the present exemplary embodiment of a VCO according to the present invention the VCO stabilizes a voltage level of the junction node NJN of the first and second transistors 221 and 222.

However, in the comparative example of a VCO as shown in FIG. 5, a voltage level of the junction node NJN of the first and second transistors 221 and 222 varies along with a variation of the power source voltage VDD. Thus, the VCO shown in FIG. 5 consumes a large amount of current and the operating characteristics thereof vary as the voltage level of the power source voltage VDD varies.

The exemplary embodiment of a VCO according to the present invention is modifiable into various alternative exemplary embodiments including various different schematic diagrams. One such alternative exemplary embodiment is shown in FIG. 6.

Figure 6:
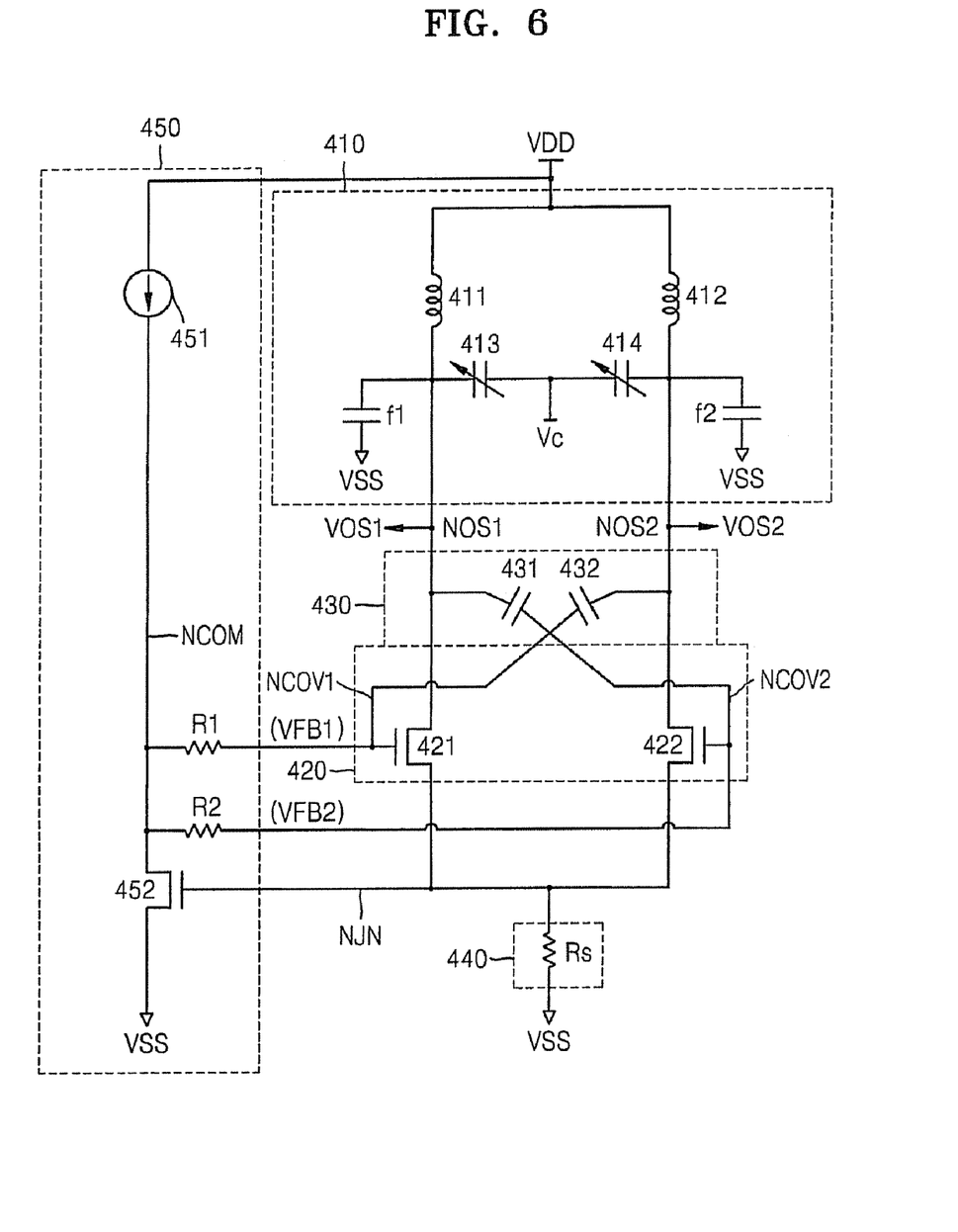
FIG. 6 illustrates another exemplary embodiment of a VCO according to the present invention.

FIG. 6 illustrates another exemplary embodiment of a VCO according to the present invention. The alternative exemplary embodiment of a VCO of FIG. 6 includes an LC bank 410, a negative resistor circuit 420, a DC block 430, and an AC block 440 and a bias circuit 450.

The LC bank 410, the negative resistor circuit 420, the DC block 430, and the AC block 440 and the individual components thereof are substantially similar to the LC bank 210, the negative circuit 220, the DC block 230, the AC block 240 of the previous exemplary embodiment of a VCO according to the present invention in both structure and operation. Therefore further description thereof will be omitted.

The alternative exemplary embodiment of a VCO according to the present invention as shown in FIG. 6 is different from that of FIG. 2, in that the VCO of FIG. 6 includes the singular bias circuit 450 while the VCO of FIG. 2 includes the first and second bias circuits 250 and 260. In the VCO of FIG. 2, the feedback voltages VFB1 and VFB2 provided to the first and second control nodes NCON1 and NCON2, respectively, are generated from the first and second bias circuits 250 and 260, respectively, but in the VCO of FIG. 6, the feedback voltages provided to first and second control nodes NCON1 and NCON2 are both generated from the single bias circuit 450.

Hereinafter the bias circuit 450 will be described in greater detail. The bias circuit 450 is controlled by a junction node NJN connected to source terminals of first and second transistors 421 and 422. The junction node NJN provides first and second feedback voltages VFB1 and VFB2 to first and second control nodes NCON1 and NCON2.

The bias circuit 450 includes a voltage supply 451 and a third transistor 452, a first resistor R1, and a second resistor R2. The voltage supply 451 is interposed between the power source voltage VDD and a common connection node NCOM and is electrically connected to the first control node NCON1, supplying a current to the third transistor 452. The third transistor 452 is connected between the common connection node NCOM and the ground voltage VSS, and is controlled by a voltage supplied from the junction node NJN which is connected to the first and second transistors 421 and 422.

In one exemplary embodiment the third transistor 452 is an NMOS transistor. In such an exemplary embodiment a gate of the third transistor 452 is coupled to the junction node NJN of the first and second transistors 421 and 422.

The first resistor R1 is connected between the common connection node NCOM and a first control node NCON1. The second resistor R2 is connected between the common connection node NCOM and the second control node NCON2. The first and second resistors R1 and R2 may prevent a short circuit between the first and second control nodes NCON1 and NCON2.

The third transistor 452 of the bias circuit 450 maintains a stable voltage at the junction node NJN of the first and second transistors 421 and 422.

For example, if a voltage level at the junction node NJN of the first and second transistors 421 and 422 rapidly increases, conductance of the third transistor 452 temporarily increases. Then, voltage levels of the common connection node NCOM, and the first and second common connection nodes NCON1 and NCON2 connected thereto, decreases, thereby decreasing a voltage level at the junction node NJN of the first and second transistors 421 and 422.

Conversely, if a voltage level at the junction node NJN of the first and second transistors 421 and 422 rapidly decreases, conductance of the third transistor 452 becomes temporarily smaller. Then, voltage levels of the common connection node NCOM, and the first and second control nodes NCON1 and NCON2 connected thereto, increases to raise a voltage level at the junction node NJN of the first and second transistors 421 and 422.

Thus, the junction node NJN of the first and second transistors 421 and 422 is able to stably maintain its voltage level.

In the exemplary embodiment of a VCO shown in FIG. 6, similar to the exemplary embodiment shown in FIG. 2, the AC block 440 is formed to include a source resistor Rs and the bias circuit 450 stabilizes the source voltages of the transistors of the negative resistor circuit 420. Thereby, the exemplary embodiment of a VCO of FIG. 6 is also able to remarkably decrease the phase noise. And, according to the exemplary embodiment of a VCO shown in FIG. 6, the single bias circuit 450 generates the feedback voltages VFB1 and VFB2 to be provided to the first and second control nodes NCON1 and NCON2, respectively.

In summary, according to the exemplary embodiments of a VCO of the present invention, since the AC block is formed of the source resistor and the bias circuits stabilize the source voltages of the transistors of the negative resistor circuit, the exemplary embodiments of a VCO of the present invention are able to remarkably decrease the phase noise.

Although the present invention has been described in connection with the exemplary embodiments illustrated in the accompanying drawings, it is not limited thereto. It will be apparent to those skilled in the art that various substitution, modifications and changes may be thereto without departing from the scope and spirit of the invention.

What is claimed is:

1. A voltage-controlled oscillator comprising:
    an inductor-capacitor bank supplied with a power source voltage and a control voltage, wherein the inductor-capacitor bank oscillates first and second oscillation nodes from which first and second oscillation signals are generated, respectively;
    a negative resistor circuit including first and second control nodes and first and second transistors which provide negative resistance to the inductor-capacitor bank, wherein the negative resistor circuit maintains the oscillation of the first and second oscillation nodes;
    a direct current block which couples the second oscillation node with the first control node and couples the first oscillation node with the second control node, wherein the first control node controls the first transistor and the second control node controls the second transistor;
    an alternating current block including a source resistor disposed between a junction node, which is connected to the first and second transistors, and a ground voltage;
    a first bias circuit controlled by the junction node, wherein the first bias circuit provides a first feedback voltage to the first control node and maintains a voltage at the junction node of the first and second transistors; and
    a second bias circuit controlled by the junction node, wherein the second bias circuit provides a second feedback voltage to the second control node and maintains a voltage at the junction node of the first and second transistors.

2. The voltage-controlled oscillator as set forth in claim 1, wherein the inductor-capacitor bank comprises:

a first inductor disposed between the first oscillation node and the power source voltage;

a first oscillation capacitor disposed between the first oscillation node and the control voltage;

a second inductor disposed between the second oscillation node and the power source voltage; and a second oscillation capacitor disposed between the second oscillation node and the control voltage.

3. The voltage-controlled oscillator as set forth in claim 1, wherein the first and second transistors are n-channel metal-oxide-semiconductor transistors, wherein the first control node is connected to a gate of the first transistor and the second control node is connected to a gate of the second transistor.

4. The voltage-controlled oscillator as set forth in claim 1, wherein the direct current block comprises:

a first direct current block capacitor disposed between the second control node and the first oscillation node; and a second direct current block capacitor disposed between the first control node and the second oscillation node.

5. The voltage-controlled oscillator as set forth in claim 1, wherein the first bias circuit comprises:

a first voltage supply disposed between the power source voltage and a first common connection node electrically connected to the first control node; and a third transistor disposed between the first common connection node and the ground voltage and controlled by a voltage level of the junction node, and wherein the second bias circuit comprises:

a second voltage supply disposed between the power source voltage and a second common connection node electrically connected to the second control node; and a fourth transistor disposed between the second common connection node and the ground voltage and controlled by a voltage level of the junction node.

6. The voltage-controlled oscillator as set forth in claim 5, wherein the third and fourth transistors are n-channel metal-oxide-semiconductor transistors, wherein gates of the third and fourth transistors are coupled to the junction node.

7. The voltage-controlled oscillator as set forth in claim 1, wherein the frequencies of the first and second oscillation signals are regulated by the control voltage.

8. A voltage-controlled oscillator comprising:

an inductor-capacitor bank supplied with a power source voltage and a control voltage, wherein the inductor-capacitor bank oscillates first and second oscillation nodes from which first and second oscillation signals are generated, respectively;

a negative resistor circuit including first and second control nodes and first and second transistors which provide negative resistance to the inductor-capacitor bank, wherein the negative resistor circuit maintains the oscillation of the first and second oscillation nodes;

a direct current block which couples the second oscillation node with the first control node and couples the first oscillation node with the second control node, wherein the first control node controls the first transistor and the second control node controls the second transistor;

an alternating current block including a source resistor disposed between a junction node, which is connected to the first and second transistors, and a ground voltage; and a bias circuit controlled by the junction node, wherein the first bias circuit provides first and second feedback voltages to the first and second control nodes, respectively, and maintains a voltage at the junction node of the first and second transistors.

9. The voltage-controlled oscillator as set forth in claim 8, wherein the inductor-capacitor bank comprises:

a first inductor disposed between the first oscillation node and the power source voltage;

a first oscillation capacitor disposed between the first oscillation node and the control voltage;

a second inductor disposed between the second oscillation node and the power source voltage; and a second oscillation capacitor disposed between the second oscillation node and the control voltage.

10. The voltage-controlled oscillator as set forth in claim 8, wherein the first and second transistors are n-channel metal-oxide-semiconductor transistors, wherein the first control node is connected to a gate of the first transistor and the second control node is connected to a gate of the second transistor.

11. The voltage-controlled oscillator as set forth in claim 8, wherein the direct current block comprises:

a first direct current block capacitor disposed between the second control node and the first oscillation node; and a second direct current block capacitor disposed between the first control node and the second oscillation node.

12. The voltage-controlled oscillator as set forth in claim 8, wherein the bias circuit comprises:

a voltage supply disposed between the power source voltage and a common connection node;

a third transistor disposed between the common connection node and the ground voltage and controlled by a voltage level of the junction node;

a first resistor disposed between the common connection node and the first control node; and a second resistor disposed between the common connection node and the second control node.

13. The voltage-controlled oscillator as set forth in claim 12, wherein the third transistor is an n-channel metal-oxide-semiconductor transistor, and wherein the gate of the third transistor is coupled to the junction node.

14. The voltage-controlled oscillator as set forth in claim 8, wherein the frequencies of the first and second oscillation signals are regulated by the control voltage.

* * * * *